(12) United States Patent
Abe et al.

(10) Patent No.: US 6,211,748 B1
(45) Date of Patent: Apr. 3, 2001

(54) FM MODULATOR

(75) Inventors: Kensaku Abe, Saitama; Yoshihiro Sugimoto; Nobuo Kobayashi, both of Tokyo; Kazuhisa Kito, Kanagawa, all of (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/445,358

(22) PCT Filed: Apr. 13, 1999

(86) PCT No.: PCT/JP99/01955

§ 371 Date: Feb. 15, 2000

§ 102(e) Date: Feb. 15, 2000

(87) PCT Pub. No.: WO99/53610

PCT Pub. Date: Oct. 21, 1999

(30) Foreign Application Priority Data

Apr. 13, 1998 (JP) .................................. 10-100882

(51) Int. Cl.[7] .............................. H03C 3/06; H03C 3/09; H04H 5/00

(52) U.S. Cl. ................................... 332/128; 381/3
(58) Field of Search ..................... 332/127, 128; 381/3–14

(56) References Cited

U.S. PATENT DOCUMENTS 4,704,727 * 11/1987 Beard ..................................... 381/13

* cited by examiner

*Primary Examiner*—David Mis
(74) *Attorney, Agent, or Firm*—Jay H. Maioli

(57) ABSTRACT

The signal source of the reference frequency of a PLL 20 is composed of a VCO 24. A VCO 14 is provided. A first audio signal (L+R) is supplied to the VCO 24 so as to control its oscillation frequency $f_{24}$. A second audio signal (L−R) is supplied to the VCO 14, so that an FM signal $S_{SUB}$ is formed whose occupied frequency band is outside the band of the first audio signal (L+R). This FM signal $S_{SUB}$ is supplied to an adder 26, hereby added to a phase comparison output that is supplied to a VCO 21 from a low-pass filter, and then supplied to the VCO 21.

3 Claims, 5 Drawing Sheets

FM MODULATOR

TECHNICAL FIELD

This invention concerns a frequency modulation circuit.

BACKGROUND ARTS

A method for rendering a signal line that connects a headphone and an audio set wirelessly using an FM wave has been made practical.

In that case, processing to be executed in the audio set, comprises:

(1) forming the sum signal (L+R) and the difference signal (L−R) from the left-channel audio signal L and the right-channel audio signal R;

(2) performing frequency modulation of the sub-carrier signal by the difference signal (L−R), in order to obtain the FM signal $S_{SUB}$;

(3) performing frequency modulation of the main carrier signal by the addition signal $S_{MPX}$ of the sum signal (L+R) and the FM signal $S_{SUB}$; and (4) transmitting the FM signal that is obtained in step (3) to the headphone.

That is, frequency multiplexing of the sum signal (L+R) and the difference signal (L−R) into a signal $S_{MPX}$ is performed, and the multiplexed-frequency signal $S_{MPX}$ is transmitted.

As an example, sub-carrier frequency $f_{SUB}$=50 kHz main-carrier frequency $f_{FM}$=915 MHz.

By the way, as a method for performing frequency modulation by the use of PLL, a method is known in which a modulation signal is inputted as a disturbance of the loop, that is, such a method that the modulation signal is added to the output signal of the low-pass filter that is a component of the loop. Therefore, when the FM signal according to the term (3) is to be formed, it is possible to add the addition signal $S_{MPX}$ to the output signal of the low-pass filter.

However, with modulation by disturbance, it is not possible to obtain sufficient characteristics of distortion factor, frequency response and others, at a lower frequency than the natural frequency ωn (which is determined on the basis of the loop gain and the time constant of the low-pass filter). And, in the case where the main-carrier frequency $f_{FM}$ is as high as 915 MHz as shown above, the frequency-division ratio N of the frequency divider circuit in PLL becomes as large as about 9000, hence, the natural frequency ωn becomes 100 Hz or so. Therefore, modulation by disturbance is not suitable for modulation based on the addition signal $S_{MPX}$ having frequency components lower than 100 Hz such as a musical signal.

Another method is obtain an FM signal by performing frequency modulation of the reference signal of PLL; however, in the case of this method, at a higher frequency than the natural frequency ωn, it is impossible to perform modulation having sufficient characteristics, and so it can not be used as the addition signal $S_{MPX}$ as well.

That is, performing frequency modulation in PLL conflicts with stabilizing the frequency that is the original object of PLL, and so, when modulation is performed in PLL, sufficient characteristics can not be obtained. Therefore, a method of performing modulation in PLL is only practical in mobile telephones, transceivers and other devices in which tone quality is not much of a question.

DISCLOSURE OF INVENTION

This invention solves such problems, and enables suitable frequency modulation by the use of a frequency-multiplexed signal $S_{MPX}$ in PLL.

Therefore, the present invention offers a frequency modulation circuit, which comprises a first VCO;

a frequency divider circuit for dividing an oscillated signal that is generated by the first VCO;

an oscillation circuit for outputting an oscillation signal having the reference frequency;

a phase comparison circuit for comparing the phases of the divided signal that is outputted from the frequency divider circuit and the oscillated signal of the oscillation circuit; and a low-pass filter for taking a direct-current voltage having a level that corresponds to the phase difference between the divided signal and the oscillation signal of the oscillation circuit, out of the phase comparison output of the phase comparison circuit, and the direct-current voltage that is outputted from the low-pass filter is supplied to the first VCO as a control signal for its oscillation frequency, so that a PLL is composed;

the oscillation circuit is composed of a second VCO;

a first audio signal is supplied to the second VCO, and the oscillation frequency is controlled hereby;

a sub-carrier signal is modulated by a second audio signal, so that the modulated signal is formed whose occupied band is outside the band of the first audio signal; and this modulated signal is added to the direct-current voltage that is outputted from the low-pass filter, and the obtained result is supplied to the first VCO.

In this way, frequency modulation is performed by the first audio signal, and frequency modulation is also performed by a signal modulated by the second audio signal, then an FM signal is outputted which is equivalent to that in the case of frequency modulation being performed by the frequency-multiplexed signal of the both signals.

BEST MODE FOR CARRYING OUT THE INVENTION

Embodiments of the present invention will hereinafter be described in detail with respect to the drawings.

Figure 1:
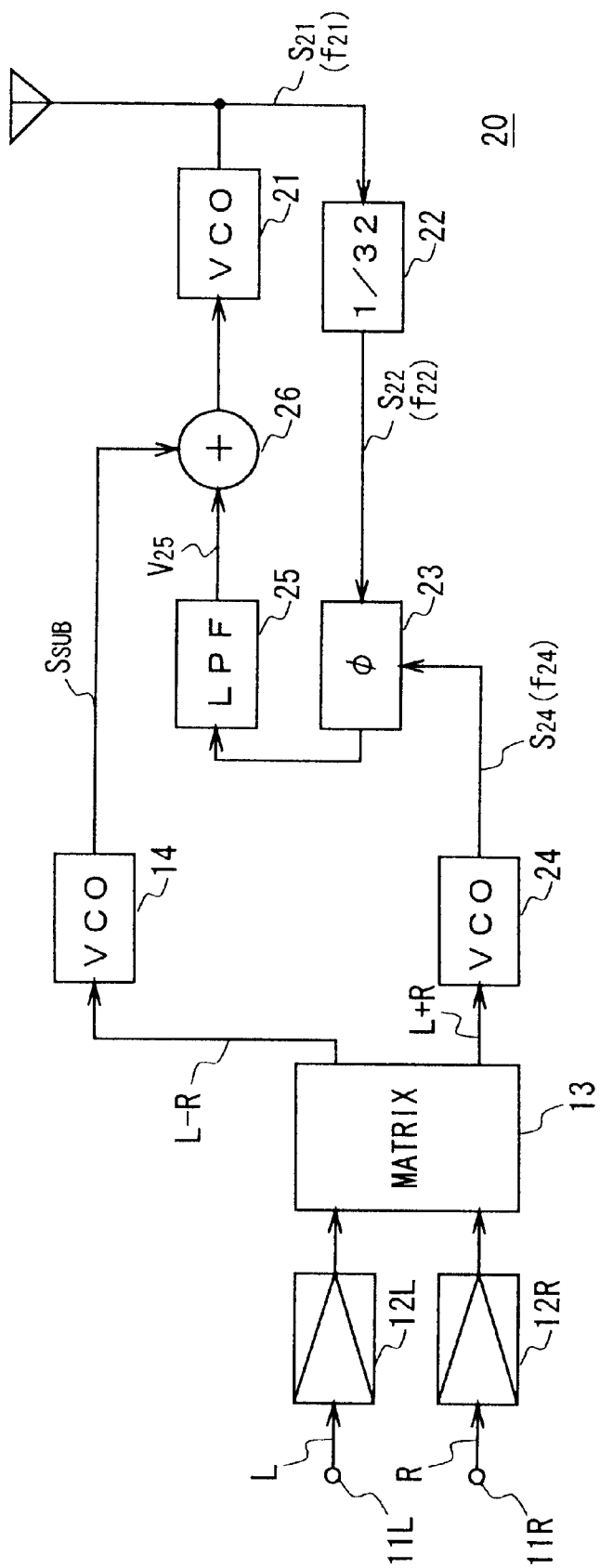
FIG. 1 is a schematic diagram showing an aspect of the present invention.

Referring to FIG. 1, a left-channel audio signal L and a right-channel audio signal R are supplied to amplifiers 12L and 12R via input terminals 11L and 11R, then amplified, and subjected to pre-emphasis; the signals L and R after this processing are then supplied to a matrix circuit 13, so that the sum signal (L+R) and the difference signal (L−R) of the signals L and R are formed.

Then, the difference signal (L−R) is supplied to a VCO 14 for frequency modulation of a sub-carrier signal as its controlling voltage so that an FM signal $S_{SUB}$ is formed, while the sum signal (L+R) is supplied to a VCO 24 as its controlling voltage, and a signal $S_{24}$ that is given frequency modulation by the signal (L+R) is outputted. In this case, as an example, the VCO 14 can be comprised of an astable multivibrator, and the VCO 24 can be comprised of a Colpitts oscillator, which includes a crystal resonator and a variable-capacity diode as the resonance elements.

As an example, the sub-carrier frequency $f_{SUB}$ of the FM signal $S_{SUB}$ is set at 50 kHz (the occupied frequency band ranges, for instance, 25 kHz–75 kHz); and the center frequency $f_{24}$ of the FM signal $S_{24}$ is set at, for instance, 1/32 of the main-carrier frequency $f_{FM}$, that is, $$f_{24}=f_{FM}/32$$

$$=915/32 \text{ [MHz]}.$$

In addition, a PLL 20 is composed. That is, a VCO 21 is placed, and its oscillation signal $S_{21}$ is supplied to a frequency divider 22 and divided into a signal $S_{22}$ whose frequency $f_{22}$ is, for instance, 1/32 of the frequency of the oscillation signal $S_{21}$. This divided signal $S_{22}$ is supplied to a phase comparison circuit 23, while the FM signal $S_{24}$ outputted from the VCO 24 is also supplied to the phase comparison circuit 23 as a signal having a reference frequency.

Then, the comparison output of this comparison circuit 23 is supplied to a low-pass filter (loop filter) 25, and a direct-current voltage $V_{25}$ whose level is corresponding to the phase difference between the signal $S_{22}$ and the signal $S_{24}$ is outputted therefrom; this direct-current voltage $V_{25}$ is supplied to the VCO 21 as its control signal, via an addition circuit 26. In this connection, the natural frequency ωn of the PLL 20 can be set higher, because the dividing ratio of the frequency divider 22 is as small as 32; this natural frequency ωn is set at, for example, 20 kHz.

At this time, the FM signal $S_{SUB}$ is supplied from the VCO 14 to the addition circuit 26, and added to the voltage $V_{25}$. And, the oscillation signal $S_{21}$ of the VCO 21 is supplied to an antenna 15 as the transmission signal.

Supposing that $S_{SUB}=0$ in such a configuration, $$f_{22}=f_{24}$$

with respect to the phase comparison circuit 23, and also $$f_{22}=f_{21}/32 \text{ [MHz]}$$

with respect to the frequency divider circuit 22, where
$f_{21}$=frequency of the oscillation signal $S_{21}$.
Therefore $$f_{21}/32=f_{24},$$

this leads to $$f_{21}=32 \cdot f_{24}$$

The frequency $f_{24}$ is given frequency modulation by the sum signal (L+R), this means that the frequency $f_{21}$ is also given frequency modulation by the sum signal (L+R). At this time, $$f_{24}=915/32 \text{ [MHz]},$$

therefore, $$f_{21}=32\times915/32 \text{ [MHz]}$$

$$=915 \text{ [MHz]},$$

in this way, the center frequency $f_{21}$ of the oscillation signal $S_{21}$ is 915 MHz.

And, when $S_{SUB}\neq 0$, this FM signal $S_{SUB}$ is supplied to the VCO 21 through the addition circuit 26 as its control signal, therefore, the oscillation signal $S_{21}$ is subjected to frequency modulation by also the FM signal $S_{SUB}$.

In this way, the oscillation signal $S_{21}$ of the VCO 21 is given frequency modulation by both the signal (L+R) and the FM signal $S_{SUB}$; this is equivalent to the oscillation signal $S_{21}$ given frequency modulation by the addition signal (multiplexed-frequency signal) $S_{MPX}$ of the sum signal (L+R) and the FM signal $S_{SUB}$. Therefore, the signal $S_{21}$ is the main FM signal in the term (4).

Thus, the circuit of FIG. 1 operates as a frequency modulation circuit; in this case, the FM signal $S_{SUB}$ is supplied to the PLL 20 as a disturbance, frequency modulation is performed, and the sum signal (L+R) is supplied as a signal for subjecting the reference signal to frequency modulation.

In modulation by disturbance, it is not possible to obtain sufficient characteristics of the distortion factor, the frequency response and others at a frequency lower than the natural frequency ωn; however, for instance it can be set as ωn=20 kHz. This makes the occupied frequency band of the FM signal $S_{SUB}$ higher than the natural frequency ωn, hence it is possible for the FM signal $S_{SUB}$ to obtain sufficient characteristics of the distortion factor, the frequency response and others.

On the other hand, when having the reference signal undergo frequency modulation, it is not possible to perform modulation having sufficient characteristics with a higher frequency than the natural frequency ωn; however, by setting, for instance, ωn=20 kHz, the occupied frequency band of the sum signal (L+R) becomes lower than the natural frequency ωn, making it possible to perform sufficient modulation with the sum signal (L+R).

Therefore, according to the frequency modulation circuit of FIG. 1, it is possible to perform frequency modulation having sufficient characteristics with the multiplexed-frequency signal $S_{MPX}$. Besides, at that time, because the natural frequency ωn is high, the lock-up time of the PLL 20 becomes shorter and the steady-state phase error becomes less, therefore, it is possible to obtain the output signal $S_{21}$ having the satisfactory C/N, and the S/N is improved. Furthermore, modulation with the sum signal (L+R) and modulation with the FM signal $S_{SUB}$ can be set to the optimum conditions, respectively.

Figure 2:
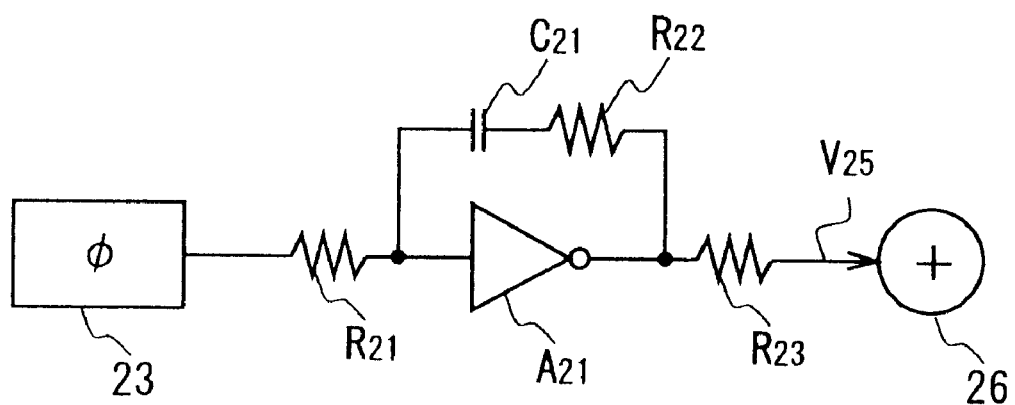
FIG. 2 is a connection diagram used for explaining the present invention.

FIG. 2 shows an example of the low-pass filter 25; in this example, it is composed of a Miller integration circuit of lag-lead type. That is, the phase comparison output of the phase comparison circuit 23 is supplied to an inverting amplifier $A_{21}$ via a resistor $R_{21}$; a capacitor $C_{21}$ and a resistor $R_{22}$ are connected in series between the input terminal and the output terminal of this amplifier $A_{21}$; the direct-current voltage $V_{25}$ is taken out through a resistor $R_{23}$.

Figure 3:
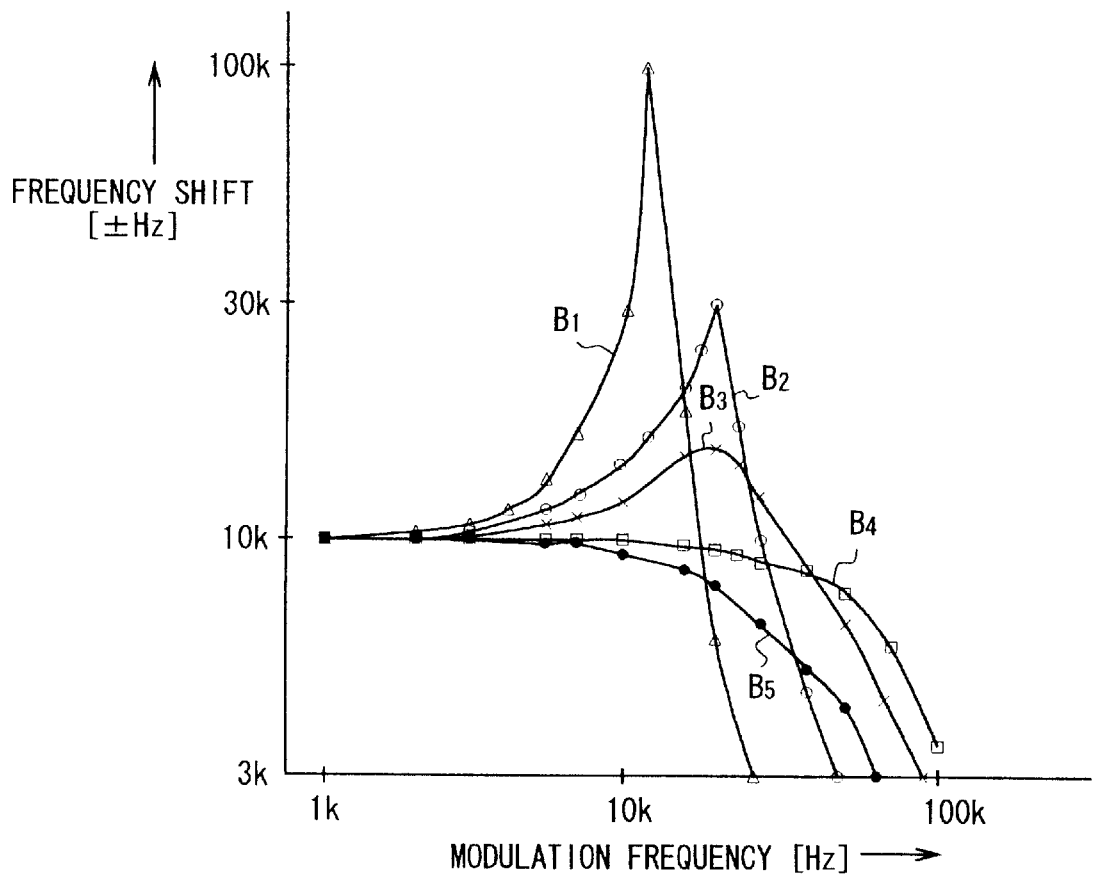
FIG. 3 is a diagram showing an example of the measurement results of the circuit according to the present invention.

FIG. 3 shows the result obtained by measuring the transfer function of the PLL 20 in the case of the low-pass filter 25 of FIG. 2 being used. That is, this result of measurement shows the characteristics of the case where the alternating signals having frequencies shown on the transverse axis are inputted to the VCO 24, in place of the signal (L+R).

| Curves | $R_{21}$ | $R_{22}$ | $C_{21}$ |
|---|---|---|---|
| $B_1$ | 120 kΩ | 2.7 kΩ | 1000 pF |
| $B_2$ | 39 kΩ | 7.8 kΩ | 470 pF |
| $B_3$ | 39 kΩ | 22.0 kΩ | 470 pF |

-continued

| Curves | $R_{21}$ | $R_{22}$ | $C_{21}$ |
|---|---|---|---|
| $B_4$ | 120 kΩ | 33.0 kΩ | 2200 pF |
| $B_5$ | 120 kΩ | 18.0 kΩ | 0.01 μF |

Where, in every cases, $R_{23}$=10 kΩ.

From the result of measurement shown in FIG. 3, it can be seen that ω=20 kHz or so. Besides, it can also be seen that the dumping characteristics vary largely according to the time constant of the low-pass filter 25. In the PLL 20 of FIG. 1, flatness of the modulation frequency characteristic is required rather than the step response of the loop, therefore, the time constant that gives the characteristic of the curve $B_5$ is adopted.

Figure 4:
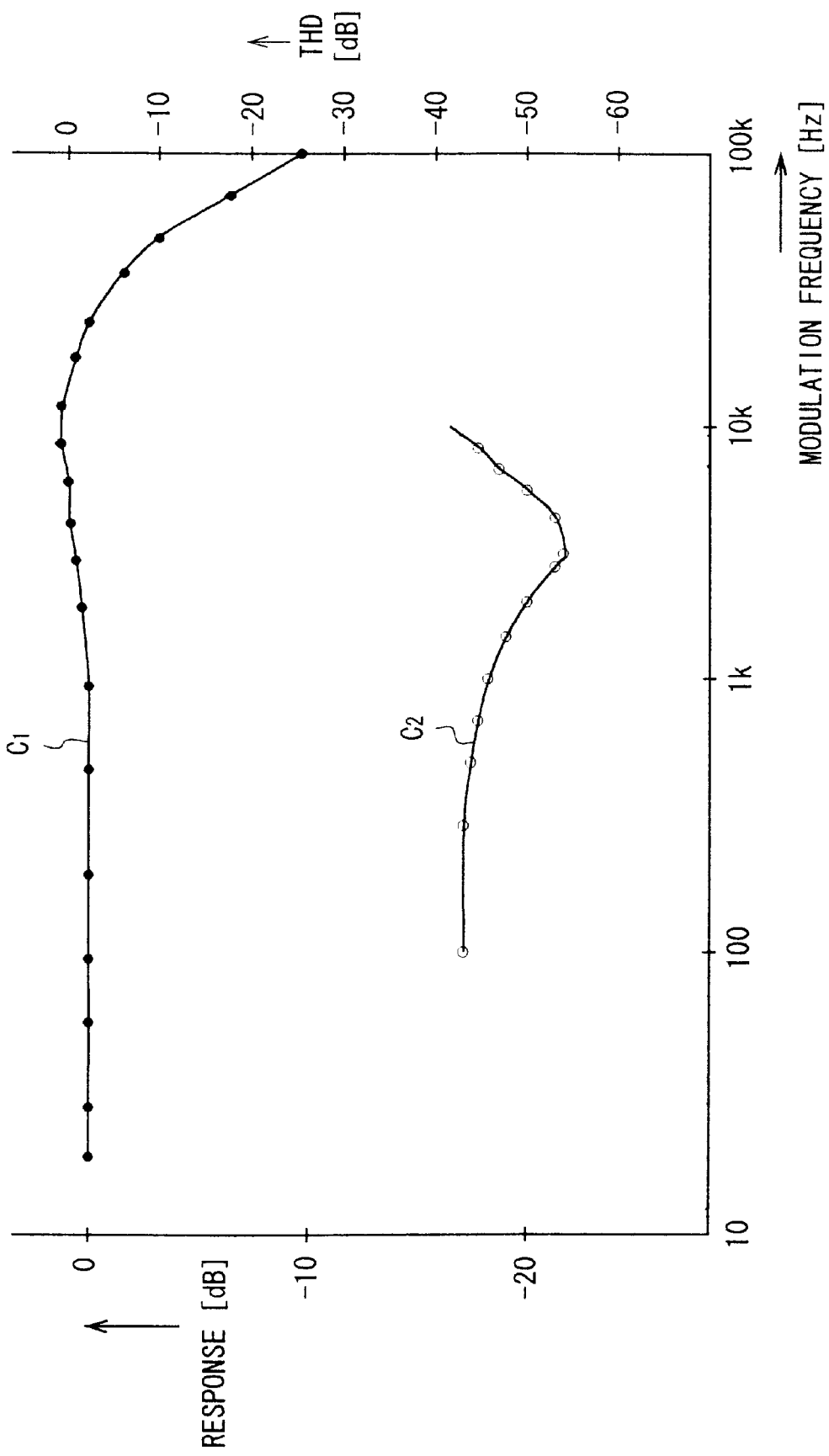
FIG. 4 is a diagram showing an example of the measurement results of the circuit according to the present invention.
Figure 5:
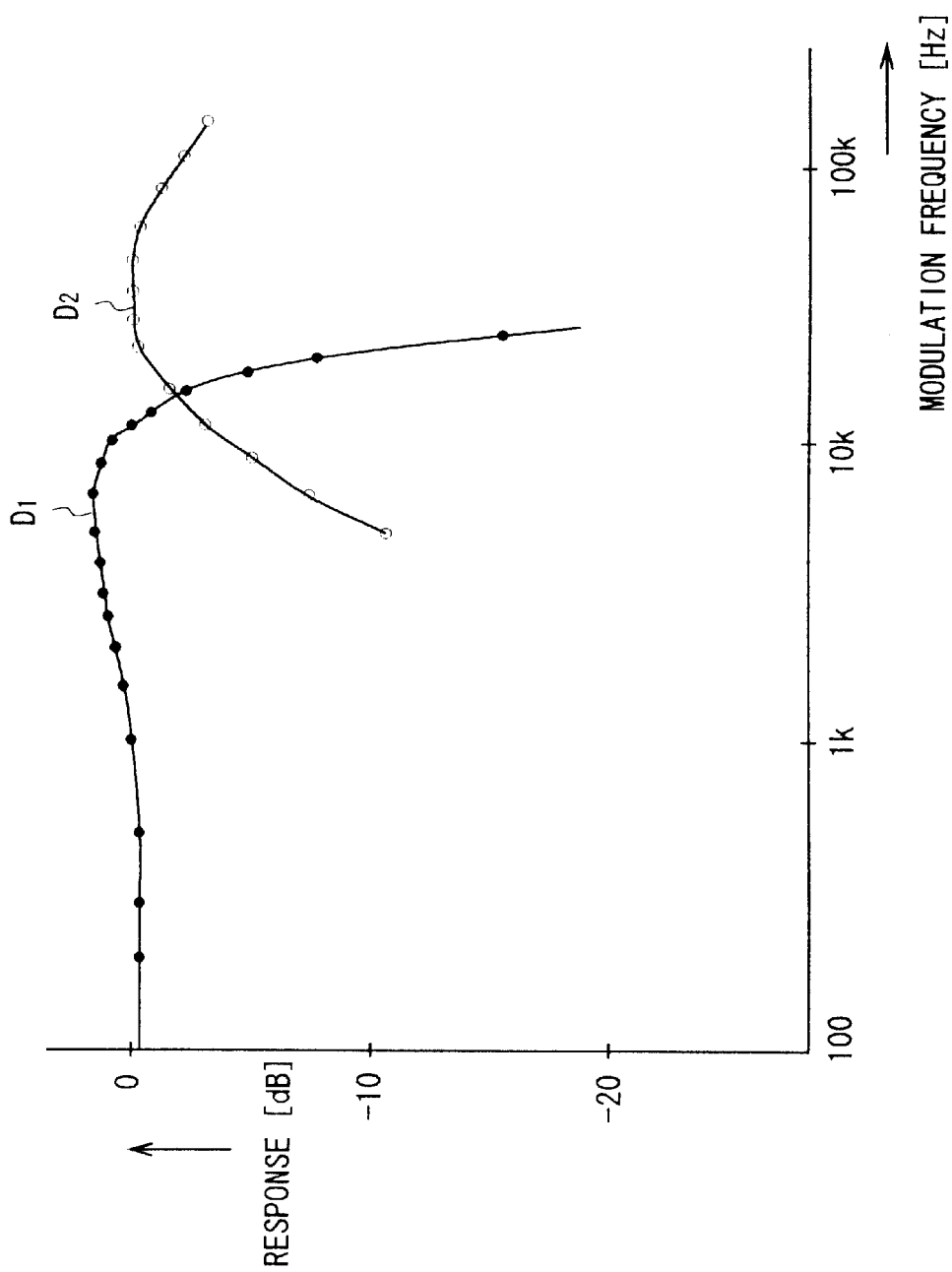
FIG. 5 is a diagram showing an example of the measurement results of the circuit according to the present invention.

FIG. 4 shows the result of measurement of the frequency response and the distortion factor of the case where the alternating signals having frequencies shown on the transverse axis have been inputted to the VCO 24, in place of the signal (L+R); the curve $C_1$ shows the frequency response, and the curve $C_2$ shows the distortion factor. In addition, FIG. 5 shows the frequency characteristics of the case where the alternating signals having frequencies shown on the transverse axis are inputted, in place of the signal (L+R) and the signal $S_{SUB}$; the curve $D_1$ corresponds to modulation by the signal (L+R), and the curve $D_2$ corresponds to modulation by the signal $S_{SUB}$; where, each alternating signal is inputted independently. And, according to the results of these measurements, the sufficient frequency characteristics and the distortion factor are obtained.

With respect to the above, by performing amplitude-modulation of the sub-carrier signal by the difference signal (L−R) from the matrix circuit 13, it is also possible to supply the resulted AM signal to the addition circuit 26; in this case, it is possible to obtain an FM signal that is similar to a signal of FM-broadcasting.

According to the present invention, even if the modulation signal is the multiplexed-frequency signal whose occupied frequency band is wide, it is possible to perform frequency modulation with its sufficient characteristics. In addition, it is possible to make the natural frequency ωn higher, and to make the lock-up time of the PLL shorter, and to make the steady-state phase error less. As a result, it is possible to obtain the FM signal having the satisfactory C/N, and to improve the S/N. Besides, it is possible to set modulation based on every frequency component of the multiplexed-frequency signal to its respective optimum condition.

INDUSTRIAL APPLICABILITY

The present invention can be applied to an audio set which has a left-channel and a right-channel.

What is claimed is:

1. A frequency modulation circuit, comprising:

a first VCO;

a frequency divider circuit for dividing an oscillation signal generated by said first VCO and for outputting a divided signal;

an oscillation circuit for outputting an oscillation signal having a reference frequency;

a phase comparison circuit for comparing phases of said divided signal output from said frequency divider circuit and said oscillation signal output from said oscillation circuit and for outputting a phase comparison output; and a low-pass filter for taking a direct-current voltage, having a level that corresponds to a phase difference between said divided signal and said oscillation signal, out of the phase comparison output of phase comparison circuit, and for outputting said direct-current voltage, wherein said direct-current voltage output from said low-pass filter is supplied to said first VCO as a control signal for its oscillation frequency, so that a PLL is composed;

said oscillation circuit is composed of a second VCO;

a first audio signal is supplied to said second VCO and an oscillation frequency thereof is controlled thereby;

a sub-carrier signal is modulated by a second audio signal, so that a modulated signal is formed having a frequency band outside a frequency band of said first audio signal; and said modulated signal is added to said direct-current voltage output from said low-pass filter, and an obtained result is supplied to said first VCO.

2. The frequency modulation circuit according to claim 1, wherein said first audio signal is a sum signal of a left-channel audio signal and a right-channel audio signal, and said second audio signal is a difference signal between said left-channel audio signal and said right-channel audio signal.

3. The frequency modulation circuit according to claim 1 or claim 2, wherein said modulated signal is an FM signal.

* * * * *